(12) United States Patent
Klein et al.

(10) Patent No.: US 10,511,099 B2
(45) Date of Patent: Dec. 17, 2019

(54) DUAL-BAND SHAPED-PATTERN QUADRIFILAR HELIX ANTENNA

(71) Applicant: AEROANTENNA TECHNOLOGY, INC., Chatsworth, CA (US)

(72) Inventors: Joseph Klein, Chatsworth, CA (US); Vladimir Kimelblat, Chatsworth, CA (US)

(73) Assignee: AEROANTENNA TECHNOLOGY, INC., Chatsworth, CA (US)

( * ) Notice: Subject to any disclaimer, the term of this patent is extended or adjusted under 35 U.S.C. 154(b) by 0 days.

(21) Appl. No.: 16/155,164

(22) Filed: Oct. 9, 2018

(65) Prior Publication Data

US 2019/0148833 A1 May 16, 2019

Related U.S. Application Data

(60) Provisional application No. 62/569,811, filed on Oct. 9, 2017.

(51) Int. Cl.
| | |
|---|---|
| *H01Q 11/08* | (2006.01) |
| *H01Q 1/08* | (2006.01) |
| *H05K 1/02* | (2006.01) |
| *H01Q 1/36* | (2006.01) |
| *H01Q 5/40* | (2015.01) |

(52) U.S. Cl.
CPC .......... *H01Q 11/08* (2013.01); *H01Q 1/085* (2013.01); *H01Q 1/362* (2013.01); *H01Q 5/40* (2015.01); *H05K 1/028* (2013.01)

(58) Field of Classification Search
CPC ........ H01Q 11/08; H01Q 1/362; H01Q 1/085; H01Q 5/40; H05K 1/028
USPC ......................................................... 343/102
See application file for complete search history.

(56) References Cited

U.S. PATENT DOCUMENTS

| | | | |
|---|---|---|---|
| 6,421,028 B1* | 7/2002 | Ohgren | H01Q 11/08 343/850 |
| 2008/0023216 A1* | 1/2008 | Hang | C03C 3/068 174/250 |

* cited by examiner

*Primary Examiner* — Hai V Tran
(74) *Attorney, Agent, or Firm* — Burr & Forman LLP

(57) ABSTRACT

A compact dual-band air core helix antenna may include two sets of quadrifilar helix antenna elements with each of the antenna elements having different arm lengths. The helix antenna may be configured such that the antenna elements are printed on a foldable printed circuit board. Radiating elements of the antenna elements may be fed with four inputs and each of the four inputs may have a same amplitude and quadrature phase difference (e.g., 0, 90, 180, 270 degree phase shifts).

9 Claims, 3 Drawing Sheets

DUAL-BAND SHAPED-PATTERN QUADRIFILAR HELIX ANTENNA

CROSS-REFERENCE TO RELATED APPLICATIONS

This application claims priority to U.S. application No. 62/569,811 filed Oct. 9, 2017, the entire contents of which are hereby incorporated by reference in its entirety.

BACKGROUND

Due to their excellent circular polarization over a wide angle, resonant quadrifilar helix antennas (QHA) are widely used in many applications. This antenna has particularly found application in satellite to ground communications, including aircraft mobile communication systems and military applications. Examples of such products include satellite navigation systems, satellite tracking and locator systems (e.g., GPS), and communications systems (e.g., NAVSTAR) that rely on satellites to relay the communications signals from one station to another.

The fractional-turn resonant quadrifilar helix produces a cardioids-shaped radiation pattern. To shape the antenna patterns prior art used multi-turn elements that are longer than one wave length.

Conventional designs could accomplish hemispherical non shaped simple patterns. However, there is no conventional design having a shaped pattern antenna using arms that are shorter than one wavelength.

Example embodiments of this disclosure provide a cosecant-squared-shaped pattern that is realized using a fractional-turn quadrifilar helix with an arm length that is less than one wavelength.

Additionally, most satellite communication and other systems require dual-band operation. One way in which a dual band antenna can be made is to stack two single-band quadrifilar helix antennas end-to-end, so that they form a single, common axis cylinder. Clearly, a big disadvantage of this solution is that such an antenna is much longer than would otherwise be desired for many applications.

Prior art techniques for providing dual-band (or Multi-Band) performance is described in U.S. Pat. No. 6,421,028. The '028 patent solves the problem of a dual frequency antenna but does not solve the shaped pattern issue.

Therefore, there is a critical need for an antenna that operates over multiple frequencies and that is in a small enough package such that it is suitable for portable applications. Example embodiments provide a technique capable of providing a shaped pattern antenna that is realized using a fractional-turn quadrifilar helix with an arm length that is less than one wavelength.

BRIEF SUMMARY OF SOME EXAMPLES

Some example embodiments are directed toward a dual-band quadrifilar helix antenna with cosecant-squared-shape radiation pattern, and particularly to such an antenna having arm length that is less than one wavelength. Multiple degrees of freedom that are provided by this QHA enables antenna patterns to be shaped arbitrarily. Antenna volume, trace shapes, number of turns, etc., are some of the parameters that define the shape of the radiation pattern.

Moreover, a QHA antenna of an example embodiment operates in two bands, which may include the L1 and L2 bands for GPS applications. Example embodiments may include four helix shaped radiating elements where each helix element consists of two parallel branches of different lengths that are in physical contact at the feeding point. The dimensions of the QHA antenna are chosen to provide optimal performance at both frequency bands. Conventional designs were not able to shape the antenna patterns over multiple frequencies.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
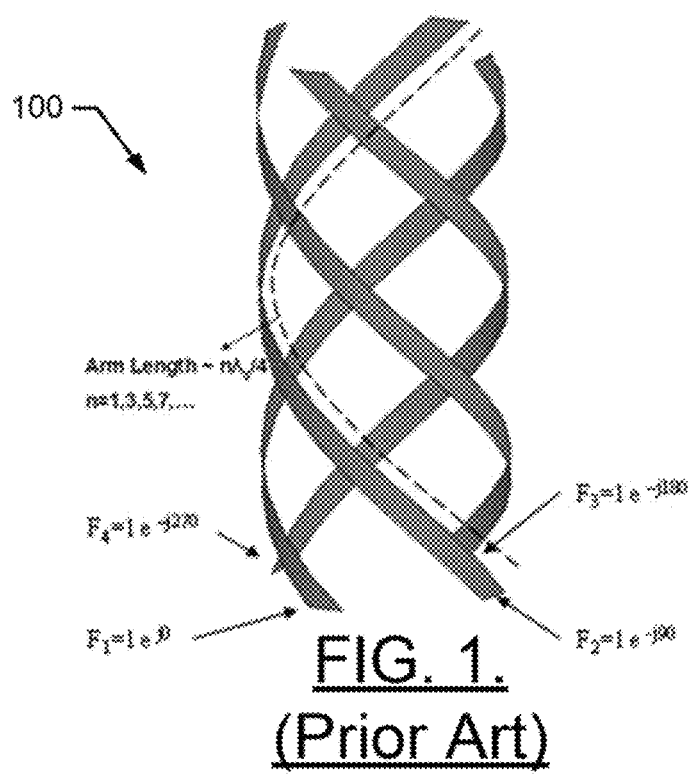
FIG. 1 illustrates a conventional single-band quadrifilar helix antenna.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true. As used herein, operable coupling should be understood to relate to direct or indirect connection that, in either case, enables functional interconnection of components that are operably coupled to each other.

As shown in FIG. 1, a conventional quadrifilar helix antenna (QHA) 100 typically consists of four symmetrically positioned helices. They are fed at ($F_1$, $F_2$, $F_3$ and $F_4$) locations with excitation coefficients of equal amplitude and in phase quadrature, i.e. 0°, 90°, 180° and 270° phase shifts. This type of excitation generates circularly polarized radiation patterns.

Figure 2:
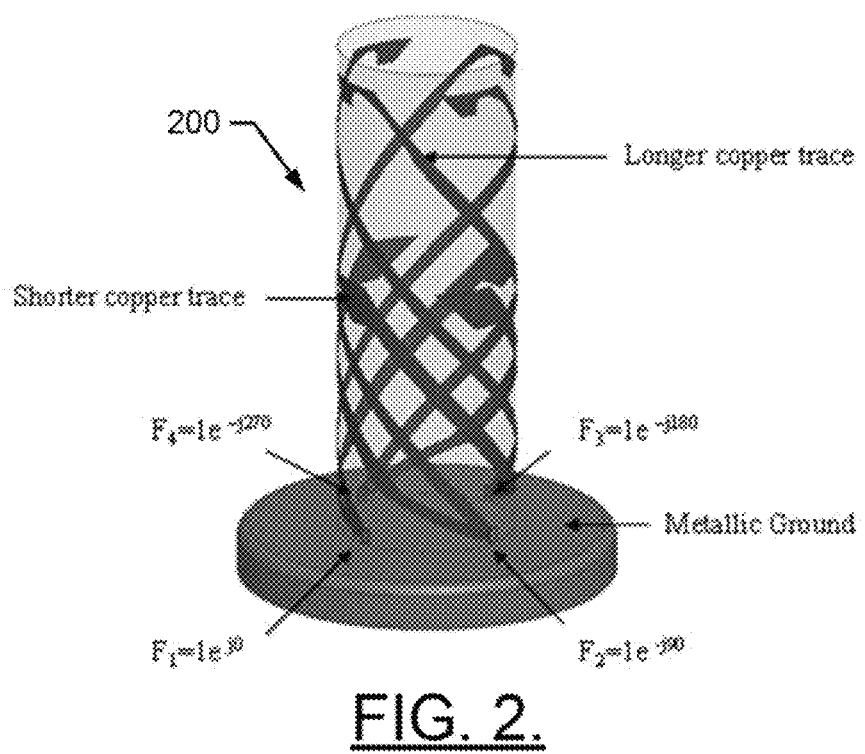
FIG. 2 illustrates a dual band quadrifilar helix antenna according to an example embodiment.

In order to resonate at two frequencies, example embodiments combine two sets of QHA antennas with different lengths on a single substrate. The two QHA antennas share the feed points. FIG. 2 illustrates one example design for a dual band quadrifilar helix antenna 200 according to an example embodiment, and how both antennas occupy the same footprint or substrate. The longer and shorter helices resonate at the lower and higher frequency bands, respectively.

The helix arms can be printed on a foldable thin printed circuit board as shown in FIG. 2. The radiating elements or helix arms should be fed by input signals with equal amplitude and quadrature phase difference. This network can be realized using various techniques. For helices with a fairly large diameter, the feeding network can be located on the ground plane. A typical design uses an LTCC (Low Temperature Cofired Ceramic) 90- hybrid coupler. In this case, an LTCC 4-way coupler was used, which provides four signals with quadrature phase differences.

Figure 3:
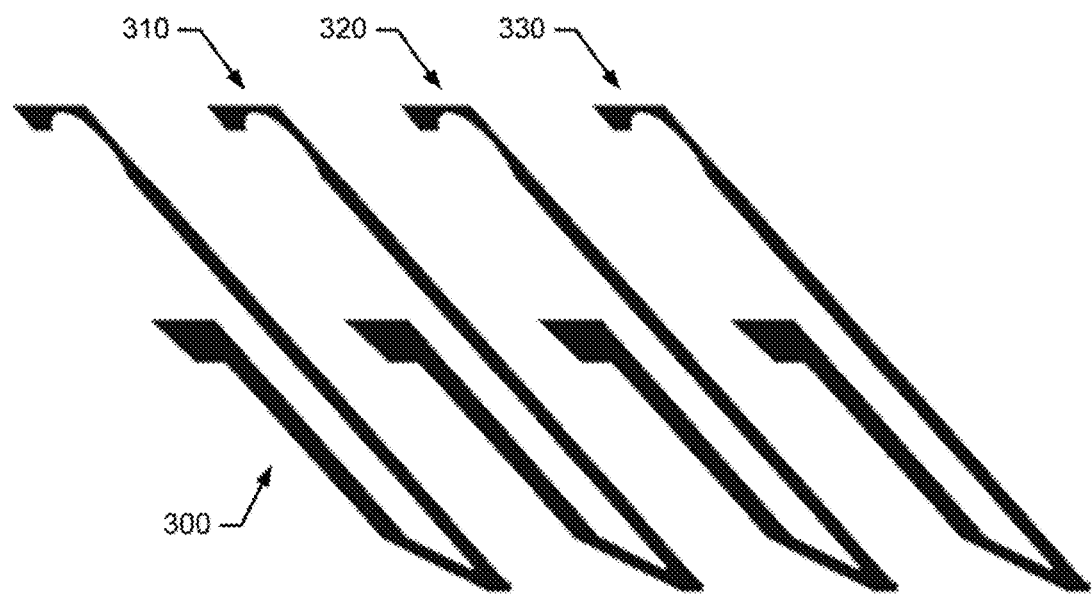
FIG. 3 illustrates a diagram of planar unwrapped printed helix traces in accordance with an example embodiment.
Figure 4:
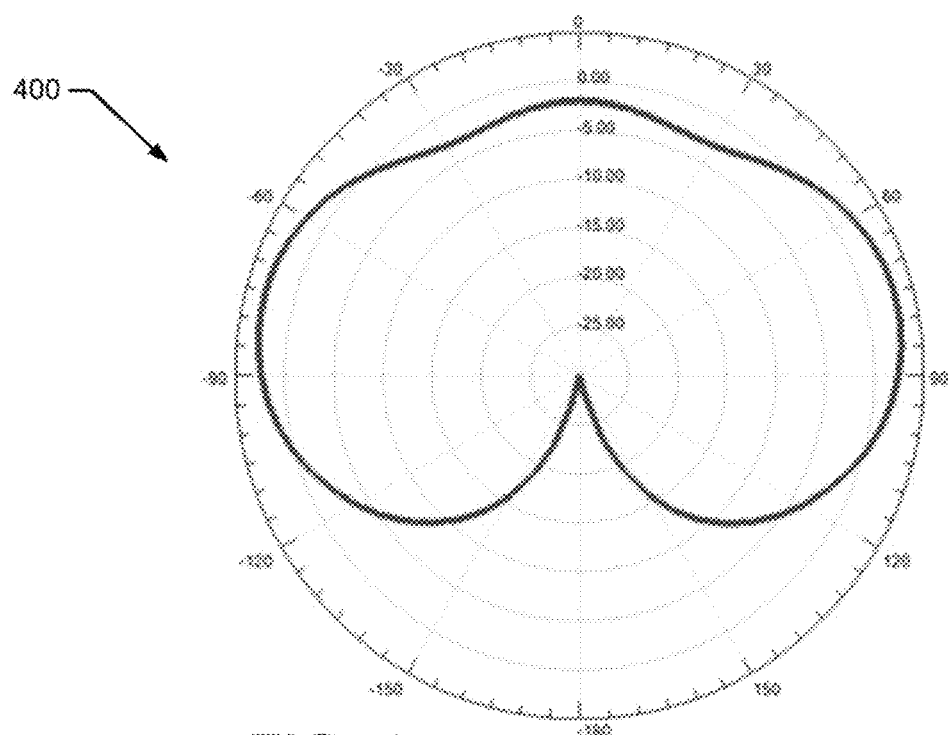
FIG. 4 illustrates a diagram of right handed circular polarization (RHCP) gain at the center of L1 at 1575 MHz in accordance with an example embodiment.
Figure 5:
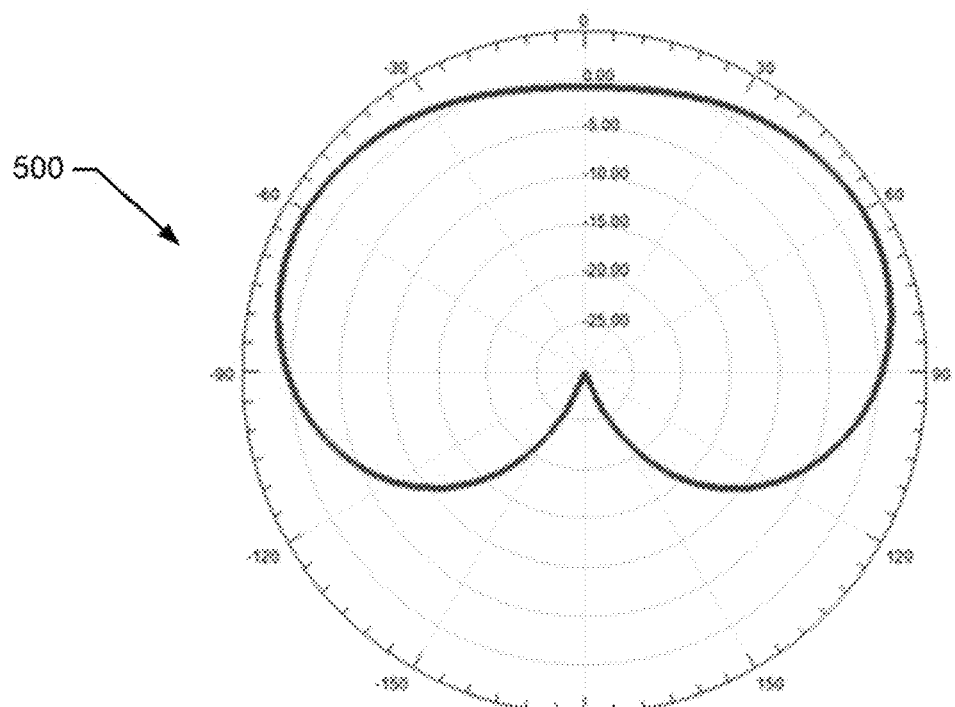
FIG. 5 illustrates a diagram of RHCP gain at the center of L2 at 1227 MHz in accordance with an example embodiment.
Figure 6:
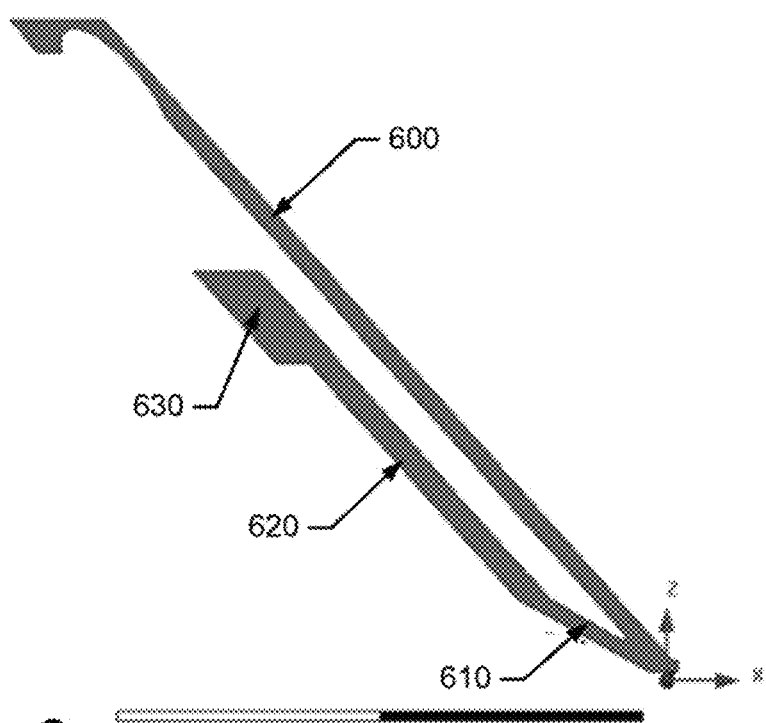
FIG. 6 illustrates a a printed trace in accordance with an example embodiment.

FIG. 3 shows the surface of the printable helix antenna prior to folding, and including a first radiating element 300, a second radiating element 310, a third radiating element 320 and a fourth radiation element 330. The cosecant-squared-shape of the radiation pattern is realized by adjusting the length and shape of each helix. For this reason, the length of each helix is slightly longer than half a turn. FIG. 4 and FIG. 5 illustrate the radiation characteristics of the antenna for L1 (1575 MHz) and L2 (1227 MHz) bands of GPS in diagrams 400 and 500, respectively. They show the right-hand circular polarization gains on the vertical cut. In the 20°<|θ|<80° range, deviation of the radiation patterns from an ideal cosecant-square shape is less than ±3 dB. FIG. 6 shows one radiating element of an example embodiment to demonstrate the positioning on the 4 helices of the radiating element.

As shown in FIG. 6, a first helix 600 extends in a first direction. A second helix 610 extends away from one end of the first helix 600 in a direction that is not parallel to the first direction. A third helix 620 extends away from a distal end of the second helix 610 (relative to the point at which the second helix 610 joined the first helix 600) in a direction that is parallel to the first direction. A fourth helix 630 extends away from a distal end of the third helix 620 (relative to the point at which the third helix 620 joined the second helix 610) in a direction that is also parallel to the first direction. Thus, the second helix 610 is not parallel to the first, third and fourth helix 600, 620 and 630. Accordingly, each antenna element or radiating element comprises four helices in each group. The second, third and fourth helices 610, 620 and 630 are connected to each other in series, while the first helix 600 extends in a direction that is substantially parallel to the third helix 620 and the fourth helix 630.

A compact dual-band air core helix antenna may include two sets of quadrifilar helix antenna elements with each of the antenna elements having different arm lengths. The helix antenna may be configured such that the antenna elements are printed on a foldable printed circuit board (or built by wire). Radiating elements of the antenna elements may be fed with four inputs and each of the four inputs may have a same amplitude and quadrature phase difference (e.g., 0, 90, 180, 270 degree phase shifts). The four inputs may be provided via an LTCC (Low Temperature Cofired Ceramic) 90-hybrid coupler. In an example embodiment, each of the antenna elements may include a first helix, a second helix, a third helix and a fourth helix. The first helix may extend in a first direction, the second helix may extend in a direction that is not parallel to the first direction away from an end of the first helix, a third helix may extend away from a distal end of the second helix relative to a point at which the second helix joined the first helix, and a fourth helix may extend away from a distal end of the third helix relative to a point at which the third helix joined the second helix. In an example embodiment, the first helix, the third helix and the fourth helix may each be parallel to each other. In an example embodiment, the second helix, the third helix and the fourth helix may be connected to each other in series. The helix antenna may be used for multi-band applications by adding more branches to the arms and, in some cases, may be dielectric all load.

A method of shaping a radiation pattern of a dual-band air core helix antenna comprising two sets of quadrifilar helix antenna elements with each of the antenna elements having different arm lengths may therefore include operations of 1) forming each of the antenna elements to include a first helix, a second helix, a third helix and a fourth helix (e.g., in the manner described above) and 2) shaping the radiation pattern by controlling a height of the antenna elements, a diameter of the helix antenna and a shape of helix traces used to form the first helix, the second helix, the third helix and the fourth helix (e.g., in the manner described above).

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A compact dual-band air core helix antenna comprising two sets of quadrifilar helix antenna elements with each of the antenna elements having different arm lengths, the helix antenna being configured such that the antenna elements are printed on a foldable printed circuit board,
    wherein radiating elements of the antenna elements are fed with four inputs, each of the four inputs having a same amplitude and quadrature phase difference,
    wherein each of the antenna elements comprises a first helix, a second helix, a third helix and a fourth helix, and
    wherein the first helix extends in a first direction, the second helix extends in a direction that is not parallel to the first direction away from an end of the first helix, a third helix extends away from a distal end of the second helix relative to a point at which the second helix joined the first helix, and a fourth helix extends away from a distal end of the third helix relative to a point at which the third helix joined the second helix.

2. The helix antenna of claim 1, wherein the four inputs are provided via an LTCC (Low Temperature Cofired Ceramic) 90-degree hybrid coupler.

3. The helix antenna of claim 1, wherein the first helix, the third helix and the fourth helix are each parallel to each other.

4. The helix antenna of claim 3, wherein the second helix, the third helix and the fourth helix are connected to each other in series.

5. A compact dual-band air core helix antenna comprising two sets of quadrifilar helix antenna elements with each of the antenna elements having different arm lengths, the helix antenna being configured such that the antenna elements are built from wire,
- wherein radiating elements of the antenna elements are fed with four inputs, each of the four inputs having a same amplitude and quadrature phase difference,
- wherein each of the antenna elements comprises a first helix, a second helix, a third helix and a fourth helix, and
- wherein the first helix extends in a first direction, the second helix extends in a direction that is not parallel to the first direction away from an end of the first helix, a third helix extends away from a distal end of the second helix relative to a point at which the second helix joined the first helix, and a fourth helix extends away from a distal end of the third helix relative to a point at which the third helix joined the second helix.

6. The helix antenna of claim 5, wherein the four inputs are provided via an LTCC (Low Temperature Cofired Ceramic) 90-degree hybrid coupler.

7. The helix antenna of claim 5, wherein the first helix, the third helix and the fourth helix are each parallel to each other.

8. The helix antenna of claim 7, wherein the second helix, the third helix and the fourth helix are connected to each other in series.

9. A method of shaping a radiation pattern of a dual-band air core helix antenna comprising two sets of quadrifilar helix antenna elements with each of the antenna elements having different arm lengths, the method comprising:
- forming each of the antenna elements to include a first helix, a second helix, a third helix and a fourth helix; and
- shaping the radiation pattern by controlling a height of the antenna elements, a diameter of the helix antenna and a shape of helix traces used to form the first helix, the second helix, the third helix and the fourth helix,
- wherein the first helix extends in a first direction, the second helix extends in a direction that is not parallel to the first direction away from an end of the first helix, a third helix extends away from a distal end of the second helix relative to a point at which the second helix joined the first helix, and a fourth helix extends away from a distal end of the third helix relative to a point at which the third helix joined the second helix.

* * * * *